United States Patent
Takahashi

(10) Patent No.: US 8,564,460 B2
(45) Date of Patent: Oct. 22, 2013

(54) KEYBOARD DEVICE AND METHOD OF IDENTIFYING A KEY OPERATION

(75) Inventor: Keisuke Takahashi, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 915 days.

(21) Appl. No.: 12/401,977

(22) Filed: Mar. 11, 2009

(65) Prior Publication Data

US 2009/0237277 A1 Sep. 24, 2009

(30) Foreign Application Priority Data

Mar. 18, 2008 (JP) .................. 2008-070147

(51) Int. Cl.
- *H03K 17/94* (2006.01)
- *H03M 11/00* (2006.01)
- *H04M 1/00* (2006.01)
- *H04M 3/00* (2006.01)
- *G06F 3/02* (2006.01)
- *G09G 5/00* (2006.01)

(52) U.S. Cl.
USPC ................. 341/24; 341/22; 341/26; 379/368; 345/168

(58) Field of Classification Search
USPC .......... 341/22, 24, 26; 345/168–169; 379/368
See application file for complete search history.

(56) References Cited

U.S. PATENT DOCUMENTS

| | | | | |
|---|---|---|---|---|
| 4,888,600 A | * | 12/1989 | Anderson et al. | 341/24 |
| 5,220,323 A | * | 6/1993 | Ito et al. | 341/24 |

FOREIGN PATENT DOCUMENTS

JP 8-328711 12/1996

OTHER PUBLICATIONS

Jun. 16, 2011 Japanese official action in connection with a counterpart Japanese patent application.

* cited by examiner

*Primary Examiner* — Mohammad Ghayour
*Assistant Examiner* — Jerold Murphy
(74) *Attorney, Agent, or Firm* — Cooper & Dunham LLP

(57) ABSTRACT

A keyboard device includes multiple key switches, a scan memory that temporarily stores a result obtained by scanning keyboard as scan data, a confirmed data memory that stores a confirmed key input, a first determination mechanism that determines whether the scan data stored in the scan memory indicates that multiple keys on a single scan line are on, a readout mechanism that reads out a data of a scan line immediately preceding the scan line that is currently scanned from the data memory, a second determination mechanism that compares the data stored in the scan memory with the readout data from the readout mechanism and determines whether a single detection line includes two keys that are on, and a key confirmation mechanism that determines a current sneak when the second mechanism detects that the single scan line includes two key switches that are on and confirms the key input.

7 Claims, 4 Drawing Sheets

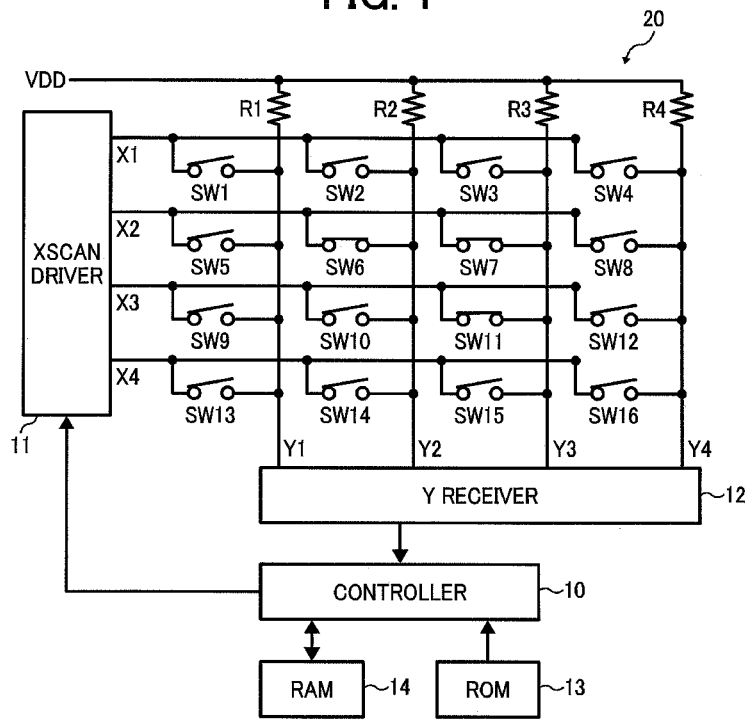

KEYBOARD DEVICE AND METHOD OF IDENTIFYING A KEY OPERATION

CROSS-REFERENCE TO RELATED APPLICATIONS

This patent specification claims priority from Japanese Patent Application No. 2008-070147, filed on Mar. 18, 2008 in the Japan Patent Office, the entire contents of which are hereby incorporated by reference herein.

BACKGROUND OF THE INVENTION

1. Field of the Invention

The present invention relates to a keyboard device that identifies a key that is pressed among multiple keys, and more particularly, to a keyboard device that is used to provide user input to an electronic device, such as a mobile phone, personal digital assistant, or handheld computer.

2. Discussion of the Background

Electronic devices such as mobile phones and handheld computers have multiple input keys, through which a variety of information is input to the device.

The keyboard device part of such electronic devices identifies a pressed key from among the multiple keys thereof, and the electronic device performs a process in accordance with the input operation specified by the pressed key.

In a scan-type keyboard including multiple keys (key switches) arranged in the form of a matrix, that is, as an array of rows and columns, several approaches have been disclosed in an attempt to provide the ability to perform multiple different operations using only a limited number of keys.

Thus, for example, in one known method, the electronic device operates differently when the user touches only a single key and when the user touches multiple keys simultaneously in combination.

However, in the keyboard device having such a configuration, when multiple keys are pressed at the same time, the signal ordinarily generated thereby might be reversed or deflected like a leak, which is called a leakage current or a sneak current. Such a sneak current can cause a so-called "dummy input", which is a phenomenon in which it appears as if a key other than the key which has actually been pressed. A detailed example of this phenomenon is described below.

A simplified key matrix of such type of keyboard device is shown in FIG. 5. Being controlled by a controller, not shown, the key matrix in which key switches SW1 through SW16 are arranged is supplied with scan signals shown as XSCAN1 to XSCAN4. The controller reads out receiving lines Y1 to Y4 via a readout receiving circuit, not shown, at a predetermined readout timing described below. The receiving signal lines Y1 to Y4 are provided with a power supply voltage via resistors R1 through R4.

Switches SW1 through SW4 are readout targets when a scan signal for XSCAN1 is output. Similarly, the switches SW5 through SW8 are readout targets when the scan signal for XSCAN2 is output. The switches SW9 through SW12 are the readout targets when the scan signal is output for XSCAN3, and switches SW13 through SW16 are the readout targets when the scan signal is output for XSCAN4.

When the three switches SW6, SW7, and SW11 are on at the same time, they are respectively read out while the scan signal is respectively being output for XSCAN2, XSCAN2, and XSCAN3.

The switches SW6 and SW7 can be read out correctly by the controller in combinations of the scan signal XSCAN3 and the receiving signal lines Y2 and Y3, respectively. However, subsequently, while the scan signal XSCAN3 is being output, the switch SW10 is read out together with the switch SW11 as being on even though the switch SW1 is not turned ON, because of a current flowing through a route "a" shown in FIG. 5 as a sneak current due to the scan signal SCAN3 and the receiving signal Y2.

Several approaches have been proposed to prevent such dummy input. In one known method, shown in FIG. 6, the keyboard device prevents the sneak and reverse current by including diodes D1 through D16 for preventing backflow of electrical current for all keys.

However, such a configuration, in which each key requires a diode, increases the number of parts, making the cost proportionally higher and proportionally increasing the size of the apparatus as well, neither of which is desirable.

SUMMARY OF THE INVENTION

In view of the foregoing, one illustrative embodiment of the present invention provides a keyboard device that includes multiple key switches respectively disposed at junctions between multiple scan lines and multiple detection lines, a scan memory that temporarily stores a result obtained by scanning the keyboard as scan data, a confirmed data memory that stores a confirmed key input, a first determination mechanism that determines whether or not the scan data stored in the scan memory indicates that at least two of the keys on a single scan line are on, a readout mechanism that reads out a data of a scan line immediately preceding the scan line that is currently scanned from the confirmed data memory, a second determination mechanism that compares the data stored in the scan memory with the readout data read out by the readout mechanism and determines whether or not a single detection line includes two keys that are on, and a key confirmation mechanism that determines a current sneak when the second mechanism detects that the single scan line includes two key switches that are on and confirms the key input.

In view of the foregoing, one illustrative embodiment of the present invention provides a method of identifying a key operation of a user in a keyboard device comprising multiple key switches disposed at junctions between multiple scan lines and multiple detection lines in a key switch matrix, storing temporarily a result obtained by scanning the keyboard as scan data in a scan memory, storing data of a confirmed key input in a confirmed data memory, determining whether or not the scan data stored in the scan memory indicates at least two of the keys on a signal scan line are on, reading out data of a scan line immediately preceding the scan line that is currently scanned from the confirmed data memory, determining whether or not a single detection line includes two keys that are on by comparing the data of the current scan line stored in the scan memory with the readout data of the preceding scan line, determining a current sneak when the second mechanism determines that the single scan line includes two key switches that are on, and confirming the key operation of the user.

In view of the foregoing, one illustrative embodiment of the present invention provides a keyboard device including multiple key switches respectively disposed at junctions between multiple scan lines and multiple detection lines, the keyboard device including, means for temporarily storing a result obtained by scanning the keyboard as scan data, means for storing confirmed data of a confirmed key input, means for determining whether or not the stared scan data indicates that at least two of the key switches on a single scan line are on, means for reading out the confirmed data of a scan line immediately preceding the scan line that is currently scanned from, means for comparing the stored scan data with the readout confirmed data, means for determining whether or not a single detection line includes two keys that are on, means for determining a current sneak when the second mechanism detects that the single scan line includes two key switches that are on, means for confirming a key operation of a user.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 is a block diagram illustrating a configuration of a keyboard device according to an illustrative embodiment of the present invention;

FIG. 2 is a schematic diagram illustrating contents of data stored in a RAM of the keyboard device shown in FIG. 1;

DETAILED DESCRIPTION OF PREFERRED EMBODIMENTS

Figure 3:
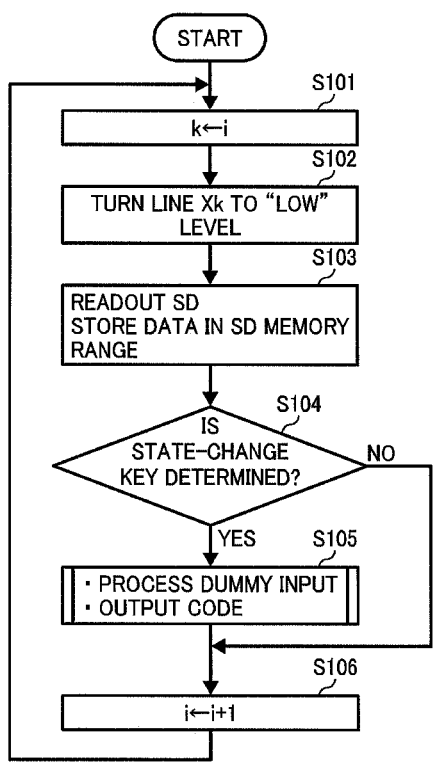
FIG. 3 is a flowchart illustrating operations of a controller shown in FIG. 1.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve a similar result.

Referring now to the drawings, wherein like reference numerals designate identical or corresponding parts throughout the several views thereof, a keyboard device according to an example embodiment of the present invention is described below.

FIG. 1 is a block diagram illustrating a configuration of a keyboard device according to an illustrative embodiment of the present invention. For simplicity, a configuration of a key matrix of the keyboard device is described below using an example in which 16 keys are arranged in an array of four rows and four columns (4×4) corresponding to a key switch matrix circuit including 16 key switches as shown in FIG. 1. However, it is to be noted that any number of key switches can be used in the key matrix, not just the 16 described herein. That is, the number of key switches arranged in the key matrix may be determined as convenient depending on usage and the type of keyboard device.

Referring to FIG. 1, a key matrix 20 includes 16 key switches SW1 through SW16 arranged in a 4×4 array. The key matrix 20 is connected to an X scan driver 11 that provides a scan signal XSCAN for a scan line and a Y receiver circuit 12 that receives signals from the key switches SW1 through SW16.

The X scan driver 11 and the Y receiver circuit 12 are controlled by a controller 10 implemented as a CPU (Central Processing Unit). The controller 10 is connected to a ROM (Read Only Memory) 13, serving as a confirmed data memory, that stores programs and the like and a RAM (Random Access Memory) 14 serving as a scan memory that contains the signals from the key switches SW1 through SW16 in the form of a table.

The X scan driver 11 is connected to respective multiple output signal lines X1, X2, X3, and X4 for scanning the keys (hereinafter "scan lines X1, X2, X3, and X4" or "X lines") via an output buffer and an output pin, not shown.

The Y receiver circuit 12 is connected to respective multiple input signal lines Y1, Y2, Y3, and Y4 for detecting the keys (hereinafter "detection lines Y1, Y2, Y3, and Y4" or "Y lines") via an input buffer and an input pin, not shown.

Each junction between the scan lines X1, X2, X3 and X4 and the detection lines Y1, Y2, Y3 and Y4 is connected to the key switches SW1 through SW16 that respectively turn on when the corresponding keys are pressed.

The input signals to the Y receiver circuit 12 via the detection lines Y1, Y2, Y3, and Y4 are kept high by pull-up resistors R1, R2, R3, and R4 while the keys corresponding to the key switches SW1 through SW16 are released.

When the input signal via any detection line Y1, Y2, Y3, or Y4 is turned "Low" by pressing any key, the controller 10 activates the X scan driver 11 and starts scanning the keys.

The key switches SW1 through SW16, respectively, are designed to be turned ON simultaneously with a push of the corresponding key, and therefore the output signal lines X1 through X4 for outputting the signals from the X scan driver 11 and the detection lines Y1 through Y4 for inputting the signals to the Y receiver circuit 12 are connected.

By controlling the state of the output buffer, the X scan driver 11 turns the signal output through each of the scan lines X1, X2, X3, and X4 to "Low" level, respectively.

While the X scan driver 11 turns the output of the X lines to low, the Y receiver circuit 12 searches for a detection line whose input signal turns to the "Low" level (hereinafter "Low level detection line"). Thus, when a "Low" level detection line is found, the Y receiver circuit 12 identifies the key being pressed based on a combination of the timing with which the X scan driver 11 turns the signal of the X line to "Low" level and the detection line that inputs the "Low" signal to the Y receiver circuit 12. This information is provided to the controller 10, and the controller 10 writes the information (data) to a predetermined or given table in the RAM 14.

As described above, the X scan driver 11 selects and activates the scan lines X1, X2, X3, and X4 sequentially. That is, the scan lines X1, X2, X3, and X4 become "Low" level sequentially. On the other hand, the Y receiver circuit 12 is connected to the detection lines Y1, Y2, Y3, and Y4, and reads blocks of ON/OFF states of the respective key switches belonging to the X line selected by the X scan driver 11. For example, when the X scan driver 11 selects the scan line X1, the Y receiver circuit 12 reads the ON/OFF states of the key switches SW1 through SW4 connected to the scan line X1.

FIG. 2 shows contents of the data stored in the RAM 14 shown in FIG. 1. The ON/OFF state of a row of the corresponding key switches, that is, scan data (SD), read by the Y receiver circuit 12 when a given X line becomes "Low" level is stored in n bits of a SD memory range in the RAM 14.

Further, the RAM 14 includes an "m×n"-bit bitmap that in the present embodiment is a "4×4"-bit bitmap corresponding to the key switches SW1 through SW16.

In FIG. 2, "0" indicates a key OFF state and "1" indicates a key ON state. However, the controller 10 also reads "1" when the key switch is in a dummy input state.

Figure 4:
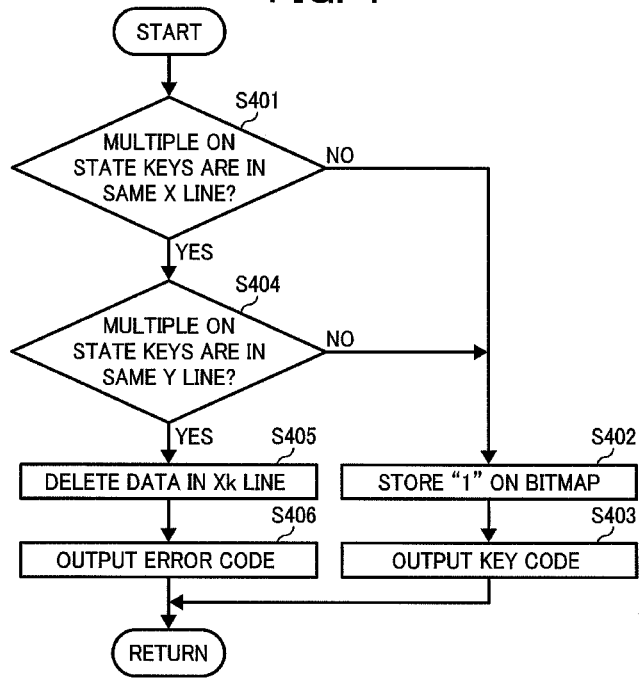
FIG. 4 is a flowchart illustrating detailed operations of the controller shown in FIG. 3.
Figure 5:
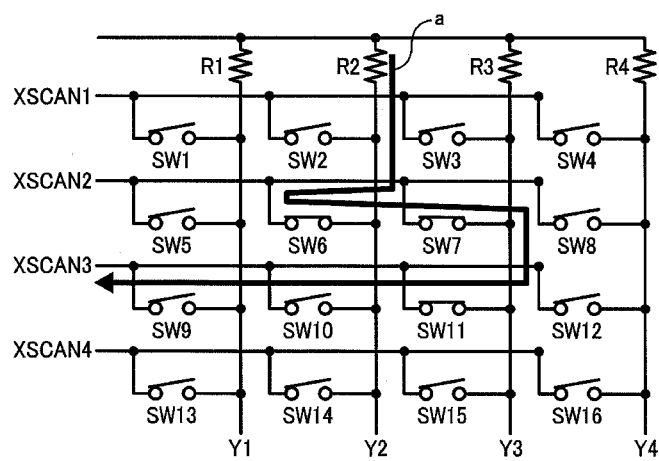
FIG. 5 is a diagram illustrating a key matrix of a known type of keyboard device.
Figure 6:
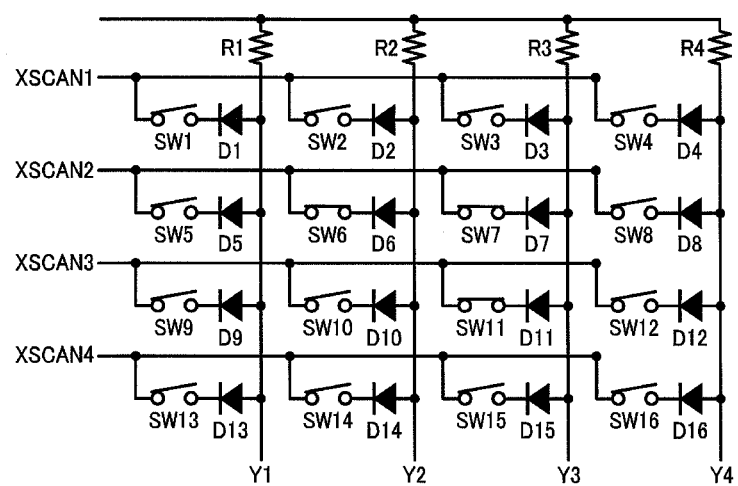
FIG. 6 is a diagram illustrating a key matrix of a known type of keyboard device including diodes for preventing backflow of current.

FIGS. 3 and 4 are flowcharts illustrating operations of the controller 10 shown in FIG. 1. The controller 10 operates according to the program contained in ROM 13. It is to be noted that "i" means any of addresses X1, X2, X3, X4 of the bitmap in FIG. 2, and changes in order of 1, 2, 3, and 4. Further, "k" means any of the X lines X1, X2, X3, X4 of matrix in FIG. 3, and changes in order of 1, 2, 3, and 4.

Referring to FIG. 3, at S101 the value of the address "i" is converted into the X line "k" by the controller 10.

Then, at S102, the X line Xk is selected and is turned to "Low" level. Subsequently, at S103, voltages in the Y lines Y1, Y2, Y3, and Y4, that is, ON/OFF states of the key switches SW1, SW2, . . . and SW16, are read out by the Y receiver circuit 12, and this data is stored in the SD memory range in the RAM 14.

Then, at S104, the controller 11 determines whether or not there is any key that changes its state between ON and OFF, among the key switches SW1 through SW16. When there is a key whose state has changed (YES at S104), the process proceeds to S105.

On the other hand, when there is no key whose state is different (NO at S104), the process proceeds to S106.

At S105, the controller 10 determines whether or not the key whose state is determines as different at S104 triggers a dummy input, and outputs a code corresponding to that key. It is to be noted that the process performed at S105 is described below in further detail with reference to FIG. 4.

Subsequently, at S106, the value of address "i" is incremented by 1. After these steps are completed, the process returns to S101 and the operations described above are repeated.

The processing of the dummy input and code output operation performed at the step S105 in FIG. 3 is described below in greater detail with reference to the flowchart shown in FIG. 4.

Referring to FIG. 4, the controller 10 starts processing the dummy input and outputting the key code, and then checks whether or not there are multiple key switches that are turned ON in the same X line.

At steps S401 and S404, the controller 10 determines whether or not the key switch that is turned ON triggers the dummy input by checking whether or not there are multiple "1" states in the SD memory range, which is a first determination mechanism.

More specifically, at S401, the scan data in the SD memory range of the RAM 14 is read out, and whether or not multiple keys in the same X line are turned ON is checked.

When there are not multiple keys switches that are ON in the same X line (NO at S401), the dummy input by current leak is not generated, and thus the process proceeds to S402. At S402 the controller 10 stores "1" in the bitmap in the RAM 14, that is, confirms the key input of the X line Xk, and then at step S403 outputs the key code of the key switch whose state is changed. After the steps S401, S402, and S403 are completed, the process returns to S106 shown in FIG. 3.

On the other hand, when the controller 10 determines that multiple "1" values are stored in the SD memory range (YES at S401), that is, there are multiple key switches whose states are turned on (YES at S401), the process proceeds to S404.

At S404, the controller 10 reads out the data of the X line immediately preceding the X line Xk that is currently being scanned, that is, the data of the X line "Xk−1", from the bitmap in the RAM 14 serving as a readout mechanism.

Then, the controller 10 compares the data of the X lines Xk and Xk−1 stored in the RAM 14, and determines whether or not both key switches of the X lines Xk and Xk−1 that are on the same Y line are turned ON, which is a second determination mechanism.

When both key switches on the same Y line are not ON (NO at S404), the dummy input by current leak is not generated, and thus the process proceeds to S402 for storing "1" of bitmap in the RAM, and then, step S403 for outputting the key code. After the steps S401, S404, S402, and S403 are completed, the process returns to S108 shown in FIG. 3.

On the other hand, when both key switches are ON (YES at S404), the process proceeds to S405. At S405, the controller 10 deletes the data of the X line Xk, and the process proceeds to S406 for outputting an error code. After these steps are completed, the process returns to S106 shown in FIG. 3.

Thus, the program reports the process of the dummy input to operator. It is to be noted that, when the dummy input is generated because three key switches that trigger the dummy input are pressed at the same time, the controller 10 outputs the error code without outputting the key code of any of these three key switches, because it is impossible to determinate which key switch has caused the error input.

With the configuration described above, when the key switches that trigger the dummy input are pressed, the controller can check for generation of the dummy input, and therefore, regardless of the number of the keys pressed, the dummy input can be excluded even when the dummy input is generated.

Therefore, by preventing the above-described malfunction, the keyboard device according to the present invention can correctly identify which of multiple keys is pressed without including diodes for preventing backflow of current.

Numerous additional modifications and variations of the present disclosure are possible in light of the above teachings. It is therefore to be understood that, within the scope of the appended claims, the disclosure of this patent specification may be practiced otherwise than as specifically described herein.

What is claimed is:

1. A keyboard device including a keyboard comprising:
multiple key switches respectively disposed at junctions between multiple scan lines and multiple detection lines;
a scan memory to temporarily store a result obtained by scanning the keyboard as scan data;
a confirmed data memory to store a confirmed key input; and
a control unit configured to read out scan data from the scan memory and, for each particular key switch indicated by the scan data read out from the scan memory to be in an on-state, determine whether or not at least one other key switch disposed on a particular scan line on which the particular key switch is disposed is also indicated by the scan data to be in an on-state,
wherein in a case that the control unit determines that no other key on the particular scan line on which the particular key switch is disposed is in an on-state, the control unit outputs a key code corresponding to the particular key switch, and
wherein the control unit compares the scan data of the particular scan line and scan data of a preceding scan line immediately preceding the particular scan line and determines whether or not an adjacent key switch, disposed on the preceding scan line that is immediately preceding the particular scan line and disposed on a same detection line on which the particular switch is disposed is in an on state and in a case that the control unit determines that at least one other key on the particular scan line on which the particular key switch is disposed is in an on-state and the control unit determines that the adjacent key switch on the preceding scan line and on the same detection line on which the particular key switch is disposed is not in an on state, the control unit outputs code corresponding to the particular key switch, wherein in a case that the control unit determines that at least one other key on the particular scan line on which the particular key switch is disposed is in an on-state and the control unit determines that the adjacent key switch on the preceding scan line and on the same detection line on which the particular key switch is disposed is in an on-state, the control unit determines that the on-state of the particular key switch is dummy input caused by sneak current, and the control unit outputs an error code, and deletes the data for the particular scan line from the confirmed data memory, and wherein when the control unit determines that three key switches, constituted by (i) the particular key switch, (ii) the one other key on the particular scan line on which the particular key switch is disposed, and (iii) the adjacent key switch on the preceding scan line and on the same detection line on which the particular key switch is disposed, are in the on-state at the same time, the control unit outputs the error code and without outputting a key code for any of said three key switches.

2. The keyboard device of claim 1, wherein in a case that the control unit determines that one other key on the particular scan line on which the particular key switch is disposed is in an on-state and the control unit determines that the adjacent key switch on the preceding scan line and on the same detection line on which the particular key switch is disposed is in an on-state, the control unit changes the scan data in the scan memory to indicate that the particular key switch is not in an on-state.

3. The keyboard device of claim 1, wherein in a case that the control unit determines that one other key on the particular scan line on which the particular key switch is disposed is in an on-state and the control unit determines that the adjacent key switch on the preceding scan line and on the same detection line on which the particular key switch is disposed is in an on-state, the control unit deletes the scan data of the particular scan line stored in the scan memory.

4. The keyboard device of claim 1, wherein in the case that the control unit determines that no other key on the particular scan line on which the particular key switch is disposed is in an on-state, the control unit stores the key code corresponding to the particular key switch in the confirmed data memory.

5. The keyboard device of claim 1, wherein in the case that the control unit determines that one other key on the particular scan line on which the particular key switch is disposed is in an on-state and the control unit determines that the adjacent key switch on the preceding scan line and on the same detection line on which the particular key switch is disposed is not in an on-state, the control unit stores the key code corresponding to the particular key switch in the confirmed data memory.

6. A method of identifying a key operation of a user in a keyboard device comprising multiple key switches disposed at junctions between multiple scan lines and multiple detection lines in a key switch matrix, said method comprising:

(a) storing temporarily a result obtained by scanning a keyboard as scan data in a scan (b) reading out the scan data from the scan memory;

(c) determining, for each particular key switch indicated by the scan data read out from the scan memory to be in an on-state, whether or not one other key switch disposed on a particular scan line on which the particular key switch is disposed is also indicated by the scan data to be in an on-state;

(d) outputting a key code corresponding to the particular key switch, in a case that it is determined in (c) that no other key on the particular scan line on which the particular key switch is disposed is in an on-state;

(e) in a case that it is determined in (c) that one other key on the particular scan line on which the particular key switch is disposed is in an on-state, comparing the scan data of the particular scan line and scan data of a preceding scan line immediately preceding the particular scan line, and determining whether or not an adjacent key switch, disposed on the preceding scan line that is immediately preceding the particular scan line and disposed on a same detection line on which the particular key switch is disposed, is in an on-state;

(f) outputting the key code corresponding to the particular key switch, in a case that it is determined in (c) that one other key on the particular scan line on which the particular key switch is disposed is in an on-state and it is determined in (e) that the adjacent key switch on the preceding scan line and on the same detection line on which the particular key switch is disposed is not in an on-state;

(g) determining that the on-state of the particular key switch is dummy input caused by sneak current, outputting an error code, and deleting the data for the particular scan line from the confirmed data memory, in a case that it is determined in (c) that one other key on the particular scan line on which the particular key switch is disposed is in an on-state and it is determined in (e) that the adjacent key switch on the preceding scan line and on the same detection line on which the particular key switch is disposed is in an on-state and (h) outputting the error code, without outputting a key code for any of three key switches, constituted by (i) the particular key switch, (ii) the one other key on the particular scan line on which the particular key switch is disposed, and (iii) the adjacent key switch on the preceding, scan line and on the same detection line on which the particular key switch is disposed, when it is determined in (g) that said three keg switches are in the on-state at the same time.

7. A keyboard device having a keyboard and including multiple key switches respectively disposed at junctions between multiple scan lines and multiple detection lines, the keyboard device comprising:

scan memory means for temporarily storing a result obtained by scanning the keyboard as scan data;

a control unit configured to read out scan data from the scan memory means and, for each particular key switch indicated by the scan data read out from the scan memory means to be in an on-state, determine whether or not one other key switch disposed on a particular scan line on which the particular key switch is disposed is also indicated by the scan data to be in an on-state, wherein, in a case that the control unit determines that no other key on the particular scan line on which the particular key switch is disposed is in an on-state, the control unit outputs a key code corresponding to the particular key switch, wherein the control unit compares the scan data of the particular scan line and scan data of a preceding scan line immediately preceding the particular scan line and determines whether or not an adjacent key switch, disposed on the preceding scan line that is immediately preceding the particular scan line and disposed on a same detection line on which the particular key switch is disposed, is in an on-state, and in a case that the control unit determines that one other key on the particular scan line on which the particular key switch is disposed is in an on-state and the control unit determines that the adjacent key switch on the preceding scan line and on the same detection line on which the particular key switch is disposed is not in an on-state, the control unit outputs the key code corresponding to the particular key switch, and wherein in a case that the control unit determines that one other key on the particular scan line on which the particular key switch is disposed is in an on-state and the control unit determines that the adjacent key switch on the preceding scan line and on the same detection line on which the particular key switch is disposed is in an on-state, the control unit determines that the on-state of the particular key switch is dummy input caused by sneak current, and the control unit outputs an error code, and deletes the data for the particular scan line from the scan memory means, and wherein when the control unit determines that three key switches, constituted by (i) the particular key switch, (ii) the one other key on the particular scan line on which the particular key switch is disposed, and (iii) the adjacent key switch on the preceding scan line and on the same detection line on which the particular key switch is disposed, are in the on-state at the same time, the control unit outputs the error code without outputting a key code for any of said three key switches.

* * * * *